(12) United States Patent
Son et al.

(10) Patent No.: US 9,954,511 B2
(45) Date of Patent: Apr. 24, 2018

(54) RADIO FREQUENCY FILTER AND MANUFACTURING METHOD THEREOF

(71) Applicant: SAMSUNG ELECTRONICS CO., LTD., Suwon-si (KR)

(72) Inventors: Sang Uk Son, Yongin-si (KR); Ho Soo Park, Yongin-si (KR); Jea Shik Shin, Hwaseong-si (KR); Duck Hwan Kim, Goyang-si (KR); Chul Soo Kim, Hwaseong-si (KR); In Sang Song, Osan-si (KR); Moon Chul Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 208 days.

(21) Appl. No.: 14/077,777

(22) Filed: Nov. 12, 2013

(65) Prior Publication Data

US 2014/0191825 A1 Jul. 10, 2014

(30) Foreign Application Priority Data

Jan. 9, 2013 (KR) .................. 10-2013-0002370

(51) Int. Cl.
| | |
|---|---|
| *H03H 9/56* | (2006.01) |
| *H03H 9/58* | (2006.01) |
| *H03H 9/15* | (2006.01) |
| *H03H 9/02* | (2006.01) |
| *H03H 9/60* | (2006.01) |

(Continued)

(52) U.S. Cl.
CPC ........ *H03H 9/02102* (2013.01); *H03H 9/173* (2013.01); *H03H 9/568* (2013.01); *H03H 9/588* (2013.01); *H03H 9/605* (2013.01); *H03H 3/04* (2013.01); *H03H 2003/0407* (2013.01); *Y10T 29/42* (2015.01)

(58) Field of Classification Search
CPC .. H03H 9/0095; H03H 9/02102; H03H 9/105; H03H 9/564; H03H 9/566; H03H 9/568; H03H 9/587; H03H 9/588; H03H 9/60; H03H 9/605; H03H 9/173
USPC .................................................. 333/189, 133
See application file for complete search history.

(56) References Cited

U.S. PATENT DOCUMENTS

| | | | | |
|---|---|---|---|---|
| 5,231,327 A | * | 7/1993 | Ketcham ................ | H03H 9/568 310/320 |
| 5,692,279 A | * | 12/1997 | Mang ...................... | H03H 3/04 29/25.35 |

(Continued)

FOREIGN PATENT DOCUMENTS

| | | | |
|---|---|---|---|
| JP | 60-68711 | * | 4/1985 |
| JP | 63-82116 | * | 4/1988 |

(Continued)

OTHER PUBLICATIONS

English language machine translation of JP 2006-33748, published Feb. 2, 2006, 12 pages.*

(Continued)

*Primary Examiner* — Barbara Summons
(74) *Attorney, Agent, or Firm* — NSIP Law

(57) ABSTRACT

A radio frequency filter and a manufacturing method thereof are provided. A radio frequency filter includes bulk acoustic wave resonators (BAWRs), the BAWRs including first BAWRs connected in series, second BAWRs connected in parallel, or a combination thereof.

20 Claims, 17 Drawing Sheets

(51) Int. Cl.
*H03H 9/17* (2006.01)
*H03H 3/04* (2006.01)

(56) References Cited

U.S. PATENT DOCUMENTS

| | | | | |
|---|---|---|---|---|
| 5,714,917 | A * | 2/1998 | Ella | 332/144 |
| 5,853,601 | A * | 12/1998 | Krishaswamy et al. | 216/2 |
| 6,355,498 | B1 * | 3/2002 | Chan et al. | 438/48 |
| 6,420,820 | B1 * | 7/2002 | Larson, III | H03H 3/04 310/346 |
| 6,741,145 | B2 * | 5/2004 | Tikka | H03H 9/605 333/133 |
| 6,842,089 | B2 * | 1/2005 | Lee | H03H 3/04 310/324 |
| 6,909,340 | B2 * | 6/2005 | Aigner | H03H 9/02157 310/312 |
| 6,927,649 | B2 * | 8/2005 | Metzger | H03H 9/0557 333/133 |
| 6,989,723 | B2 | 1/2006 | Komuro et al. | |
| 7,019,604 | B2 * | 3/2006 | Gotoh | H03H 3/04 333/187 |
| 7,161,447 | B2 * | 1/2007 | Nomura | H03H 9/02102 310/326 |
| 7,161,448 | B2 * | 1/2007 | Feng | H03H 9/02118 310/312 |
| 7,240,410 | B2 * | 7/2007 | Yamada | C23C 14/10 29/25.35 |
| 7,253,703 | B2 * | 8/2007 | Song | H03H 3/02 29/25.35 |
| 7,259,498 | B2 * | 8/2007 | Nakatsuka | H03H 9/02094 310/320 |
| 7,345,410 | B2 | 3/2008 | Grannen et al. | |
| 7,348,714 | B2 * | 3/2008 | Inoue | H03H 9/02102 310/334 |
| 7,408,428 | B2 | 8/2008 | Larson, III | |
| 7,443,270 | B2 * | 10/2008 | Motai | H03H 3/02 310/312 |
| 7,484,279 | B2 * | 2/2009 | Aoki | H03H 9/0547 29/25.35 |
| 7,508,286 | B2 | 3/2009 | Ruby et al. | |
| 7,561,009 | B2 | 7/2009 | Larson, III et al. | |
| 7,622,846 | B2 * | 11/2009 | Song | H03H 3/02 310/324 |
| 7,642,882 | B2 * | 1/2010 | Nam | H03H 3/02 333/133 |
| 7,868,522 | B2 | 1/2011 | Ruby | |
| 7,924,120 | B2 * | 4/2011 | Umeda | H03H 9/02102 310/341 |
| 8,436,516 | B2 * | 5/2013 | Ruby | H03H 3/04 310/320 |
| 2002/0093398 | A1 * | 7/2002 | Ella | H03H 3/02 333/187 |
| 2005/0174192 | A1 * | 8/2005 | Kawamura | H03H 9/564 333/133 |
| 2007/0117245 | A1 * | 5/2007 | Lee | H01L 23/10 438/50 |
| 2007/0188270 | A1 * | 8/2007 | Ohara | H03H 9/13 333/189 |
| 2008/0174389 | A1 * | 7/2008 | Mori | H03H 9/0211 333/189 |
| 2009/0134957 | A1 * | 5/2009 | Shin | H03H 9/105 333/187 |
| 2010/0134210 | A1 * | 6/2010 | Umeda | H03H 3/02 333/189 |
| 2011/0298564 | A1 * | 12/2011 | Iwashita | H03H 3/02 333/187 |
| 2011/0304412 | A1 * | 12/2011 | Zhang | H03H 3/02 333/187 |
| 2012/0049976 | A1 * | 3/2012 | Son | H03H 9/02149 333/133 |
| 2012/0154074 | A1 * | 6/2012 | Ruby | H03H 3/04 333/187 |
| 2012/0299444 | A1 * | 11/2012 | Yokoyama | H03H 9/13 310/326 |
| 2013/0027153 | A1 * | 1/2013 | Shin | H03H 9/02102 333/133 |
| 2013/0147320 | A1 * | 6/2013 | Son | H03H 9/173 310/340 |

FOREIGN PATENT DOCUMENTS

| | | | |
|---|---|---|---|
| JP | 2006-33748 | * | 2/2006 |
| JP | 3889351 B2 | | 12/2006 |
| JP | 2008-219237 | * | 9/2008 |
| JP | 4805836 B2 | | 8/2011 |
| KR | 10-2006-0057070 A | | 5/2006 |
| KR | 10-2007-0029600 A | | 3/2007 |
| KR | 10-0880791 B1 | | 1/2009 |
| KR | 10-2012-0023285 A | | 3/2012 |

OTHER PUBLICATIONS

English language machine translation of JP 2008-219237, published Sep. 18, 2008, 16 pages.*

Lakin et al., "Temperature Compensated Bulk Acoustic thin Film Resonators", 2000 IEEE Ultrasonics Symposium, vol. 1, pp. 855-858, Oct. 22-25, 2000.*

Korean Office Action dated Feb. 19, 2018, in corresponding Korean Application No. 10-2013-0002370 (6 pages in English, 8 pages in Korean).

* cited by examiner

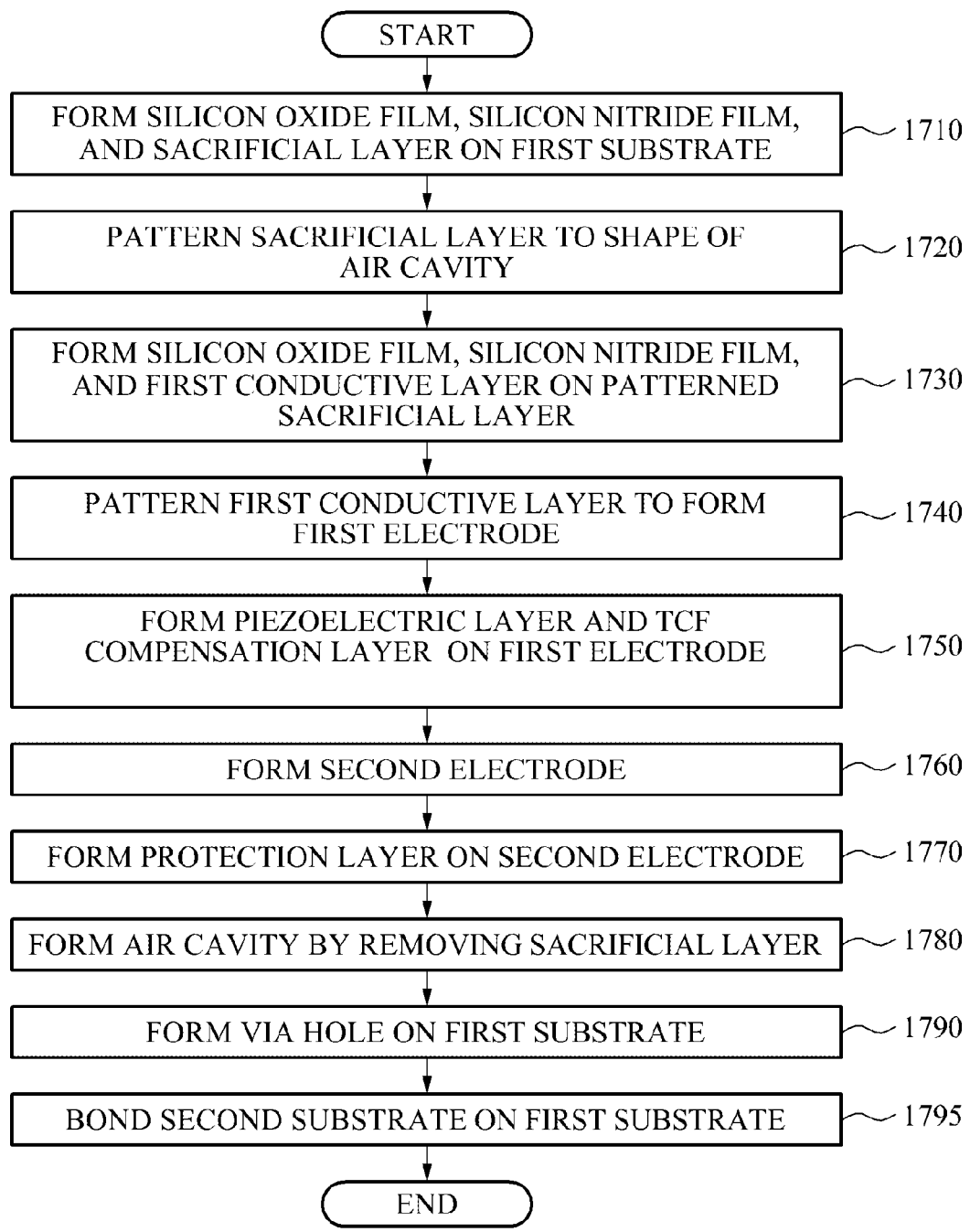

RADIO FREQUENCY FILTER AND MANUFACTURING METHOD THEREOF

CROSS-REFERENCE TO RELATED APPLICATION

This application claims the benefit under 35 USC 119(a) of Korean Patent Application No. 10-2013-0002370 filed on Jan. 9, 2013, in the Korean Intellectual Property Office, the entire disclosure of which is incorporated herein by reference for all purposes.

BACKGROUND

1. Field

The following description relates to a radio frequency filter and a manufacturing method thereof.

2. Description of Related Art

A communication terminal refers to a device that transmits and receives a communication signal. A communication terminal may transmit a signal using a transmission frequency, and may receive a signal using a reception frequency. During the transmission and reception of signals, a consistent band gap between the transmission frequency and the reception frequency may be maintained to prevent an occurrence of interference between the transmitted signal and the received signal. However, because frequency resources are limited in quantity, it is desirable to reduce the band gap between the transmission frequency and the reception frequency.

As communication terminals are continually reduced in size, communication chips used therein are also reduced in size. Further, chips that perform various functions are integrated into a small space. However, a high level of reliability must be still maintained in the communication terminals in such a state. With the size reduction of the communication terminals, when changes occur in an environmental temperature and an internal temperature of the communication terminals, a material property of components may also change and lead to a degradation of call quality. As the band gap between frequency bands used for communication decreases, an environmental temperature change may cause interference between frequency bands, resulting in an adverse effect on a call quality.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a radio frequency filter including bulk acoustic wave resonators (BAWRs), the BAWRs including first BAWRs connected in series, second BAWRs connected in parallel, or a combination thereof.

At least one of the BAWRs may include a membrane, a first electrode, a piezoelectric layer, and a second electrode, disposed in that order above a first substrate, at least a portion of the membrane being spaced apart from the first substrate as to form an air cavity therebetween.

The at least one of the BAWRs further include a temperature coefficient of frequency (TCF) compensation layer configured to compensate for a TCF of the first electrode, the piezoelectric layer, or the second electrode.

The at least one of the BAWRs further include a protection layer disposed on the second electrode.

The TCF compensation layer may be disposed between the piezoelectric layer and the second electrode, and a width of the TCF compensation layer is less than or equal to a width of the piezoelectric layer or a width of the second electrode.

The TCF compensation layer may be disposed between the piezoelectric layer and the first electrode, and a width of the TCF compensation layer may be less than or equal to a width of the piezoelectric layer or a width of the first electrode.

The TCF compensation layer may be disposed between the first electrode and the membrane, and a width of the TCF compensation layer may be less than or equal to a width of the first electrode or a width of the membrane.

The TCF compensation layer may be disposed between the second electrode and a protection layer, and a width of the TCF compensation layer may be less than or equal to a width of the piezoelectric layer or a width of the protection layer.

At least one of the first BAWRs may include a TCF compensation layer.

At least one of the second BAWRs may include a TCF compensation layer.

The general aspect of the radio frequency filter may include: a second substrate bonded to the first substrate as to form a second air cavity between the first substrate and a lower surface of the second substrate.

At least one of the first BAWRs may include a TCF compensation layer configured to compensate for a change due to a temperature change of a high frequency band in a bandwidth of a radio frequency filter, and at least one of the second BAWRs may include a TCF compensation layer configured to compensate for a change due to a temperature change of a low frequency band in a bandwidth of the radio frequency filter.

The TCF compensation layer may include at least one selected from the group consisting of a silicon oxide type, a silicon nitride type, a polymer, a carbon material, a metal, and a metal oxide material.

The BAWRs each may include a first electrode, a piezoelectric layer, and a second electrode; and a plurality of the second electrodes of the first BAWRs may be connected to a plurality of second electrodes of the second BAWRs.

The BAWRs each may include a first electrode, a piezoelectric layer, and a second electrode; and a plurality of second electrodes of the first BAWRs may be connected to a plurality of first electrodes of the second BAWRs.

In another general aspect, there is provided a method for manufacturing a radio frequency filter, the method involving: forming a silicon oxide film, a silicon nitride film, and a sacrificial layer above a substrate in that order; patterning the sacrificial layer according to a shape of an air cavity; forming a silicon oxide film, a silicon nitride film, a first conductive layer above the patterned sacrificial layer in that order; forming a first electrode from the first conductive layer; forming a piezoelectric layer and a second conductive layer above the first electrode; forming a second electrode from the second conductive layer, based on at least one of a serial connection, a parallel connection, or a combination thereof of bulk acoustic wave resonators (BAWRs); forming a protection layer on the second electrode; generating the air cavity by removing the sacrificial layer; and generating a via hole by etching the substrate.

The general aspect of the method may further include: depositing a temperature coefficient of frequency (TCF)

compensation material on the piezoelectric layer, subsequent to the forming of the piezoelectric layer; and forming a TCF compensation layer having a width less than or equal to a width of the piezoelectric layer or a width of the second electrode by patterning the TCF compensation material.

The general aspect of the method may further include: depositing a TCF compensation material on the first electrode, subsequent to the forming of the first electrode; and forming a TCF compensation layer having a width less than or equal to a width of the first electrode or a width of the piezoelectric layer by patterning the TCF compensation material.

In another general aspect of the method, a method for manufacturing a radio frequency filter involves: forming a sacrificial layer on a first substrate; forming a first electrode, a piezoelectric layer, a temperature coefficient of frequency (TCF) compensation layer, and a second electrode above the sacrificial layer; removing the sacrificial layer to generate an air cavity, wherein the TCF compensation layer is formed either between the first electrode and the piezoelectric layer or between the piezoelectric layer and the second electrode.

The second electrode may be formed as to connect a plurality of bulk acoustic wave resonators (BAWRs) in a serial connection or a parallel connection.

Other features and aspects will be apparent from the following detailed description, the drawings, and the claims.

BRIEF DESCRIPTION OF THE DRAWINGS

FIG. 17 is a flow chart illustrating an example of a method of fabricating a radio frequency filter.

Figure 1:
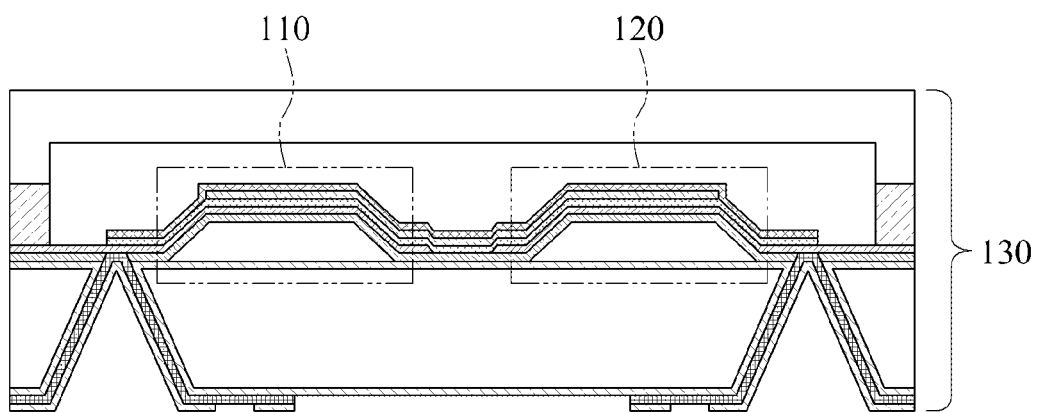
FIG. 1 is a cross-sectional view of an example of a radio frequency filter.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness. The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless indicated otherwise, a statement that a first layer is "on" a second layer or a substrate is to be interpreted as covering both a case where the first layer is directly contacts the second layer or the substrate, and a case where one or more other layers are disposed between the first layer and the second layer or the substrate.

The spatially-relative expressions such as "below", "beneath", "lower", "above", "upper", and the like may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

An example of a radio frequency filter according to the present disclosure may be implemented as a bulk acoustic wave resonator (BAWR). The BAWR may operate through an electrode disposed on an upper and lower portion of a piezoelectric layer. The BAWR may operate through the piezoelectric layer that vibrates when a high frequency signal is applied to its upper electrode or to its lower electrode.

The BAWR may be used in a wireless system for transmitting a signal. For example, the BAWR may be used as a configuration of a wireless communication device, a wireless power transmission, a filter of a wireless sensor, a transmitter, a receiver, a duplexer or the like. In addition, the BAWR may be used for inputting and outputting of wireless data.

According to one example, the radio frequency filter may be used as a component for transmitting and receiving an electric wave by being connected to an antenna of a wireless communication device, such as the antenna of a mobile phone, a mobile electronic notepad, a wireless repeater, and the like. The radio frequency filter may be also used as a transmission filter (Tx) for transmitting a signal in a frequency band to be transmitted, or be used as a reception filter (Rx) for receiving a signal in a frequency band to be received. The two filters may basically have an identical physical structure, while being designed for different frequency band. A structure and a form in which a TCF compensation layer is disposed in the radio frequency filter described herein may be applied to other electronic components that require property maintenance based on a temperature change, such as an oscillator, an inductor, a capacitor, in addition to a communication chip.

A cross-section of the BAWR may illustrate a first electrode, a piezoelectric layer, and a second electrode, and a plan view of the BAWR may illustrate the BAWR to have an oval shape, a circular shape, an elliptical shape or an atypical elliptical shape, for example.

The BAWR may include an air cavity on an upper portion of a substrate to enhance a reflection property of an acoustic wave.

In a radio frequency filter having a band pass property, multiple BAWRs may be disposed on a plane, and the BAWRs may be connected by a common electrode to enhance a reflection property or a transmission property in a frequency band range.

A metal used to form the electrode of the BAWR may require a high speed of acoustic wave propagation, low electric resistance, small thermal property change, and the like. Accordingly, molybdenum (Mo), ruthenium (Ru), gold (Au), and the like, may be used to form the electrode. The electrode may be manufactured, based on a design frequency and property of the BAWR, to have a thickness in a range of thousands of angstroms (Å).

FIG. 1 illustrates an example of a radio frequency filter 130.

Referring to FIG. 1, the radio frequency filter 130 may include a serial resonator 110 and a parallel resonator 120. The serial resonator 110 may be a BAWR connected in series, and the parallel resonator 120 may be a BAWR connected in parallel. Although the example of radio frequency filter 130 illustrated in FIG. 1 includes a serial resonator 110 and a parallel resonator 120, in other examples, the radio frequency filter 130 may include only a serial resonator 110 or only a parallel resonator 120.

Further, in another example, the radio frequency filter 130 may include a plurality of BAWRs. The plurality of BAWRs may be connected in series or in parallel.

The BAWR may include a first electrode, a piezoelectric layer, and a second electrode. The piezoelectric layer may be disposed between the first electrode and the second electrode. The BAWR may generate a resonant frequency and an anti-resonant frequency by resonating the piezoelectric layer based on a signal applied to the first electrode and the second electrode.

The BAWR may utilize an acoustic wave of a piezoelectric material to generate resonance. When a radio frequency (RF) signal is applied to the piezoelectric material, the acoustic wave may be generated through a mechanical vibration occurring in a thickness direction of a piezoelectric film. For example, zinc oxide (ZnO), aluminium nitride (AlN), quartz, and the like, may be included in the piezoelectric material.

A resonance may occur when a half (½) of a wavelength of the RF signal applied coincides with a thickness of the piezoelectric film. When the resonance occurs, the BAWR may be used as a filter for selecting a frequency because electric impedance may change sharply. The resonant frequency may be determined by a thickness of the piezoelectric film, an electrode surrounding the piezoelectric film, and a unique elastic wave speed of the piezoelectric film, and the like. In this instance, the thinner the thickness of the piezoelectric film, the higher the resonant frequency.

The first electrode and the second electrode may be formed by metals, such as, Au, Mo, Ru, aluminum (Al), platinum (Pt), titanium (Ti), tungsten (W), palladium (Pd), chromium (Cr), nickel (Ni), and the like.

The first electrode may be disposed on an upper portion of a membrane. The membrane disposed on an upper portion of an air cavity may maintain a shape of the air cavity, and support a structure of the BAWR.

A reflection property of an acoustic wave generated in the BAWR due to the air cavity may be enhanced. The acoustic wave may remain in the BAWR without being lost to the air cavity because impedance of the air cavity is close to infinity.

The air cavity may be generated through etching inside a first substrate, or generated using a sacrificial layer patterned to match the shape of the air cavity on the upper portion of the first substrate.

The BAWR may further include a protection layer. The protection layer may be disposed on an upper portion of a second electric layer. The protection layer may protect the second substrate from being exposed to an external environment. The protection layer may be formed of an insulation material. Examples of insulation materials that may be used include materials such as silicon oxide, silicon nitride, and aluminum nitride (AlN). The protection layer may be used for adjusting the resonant frequency.

The protection layer may be layered on the upper portion of the first substrate. The protection layer may be used for preventing a substrate from being damaged in a process of forming the air cavity. The air cavity may be generated with a sacrificial layer that is removed by gas injected via a release hole (not shown). In this instance, the protection layer may prevent the first substrate from being damaged by the injected gas.

A via hole may be formed in a predetermined area of the first substrate.

The via hole may penetrate through the first substrate, and may serve as a passage that connects the first electrode and an external electrode. The first electrode may connect to the external electrode through a conductive layer layered in the via hole. For example, the first electrode may connect to the external electrode through an electrode pad of the conductive layer. An external signal may be applied to the first electrode from the external electrode. Alternatively, the signal outputted from the first electrode may be transferred to the external electrode through the electrode pad.

Another via hole may have a structure penetrating the first substrate, and may serve as a passage connecting the second electrode and an external electrode. The second electrode may connect to the external electrode through a conductive layer layered in the via hole. For example, the second electrode may be connected to the external electrode through an electrode pad of the conductive layer. With the electrode pad, an external signal may be applied to the second electrode from the external electrode. Alternatively, the signal outputted from the second electrode may be transferred to the external electrode through the electrode pad.

The first substrate may be formed by silicon or polysilicon as a configuration material. A protection layer may be formed, by an insulation material, in the conductive layer to expose only a predetermined area of an electric pad.

The radio frequency filter 130 may be generated through manufacturing the serial resonator 110 and the parallel resonator 120.

A method for manufacturing the radio frequency filter 130 may involve forming layers of a silicon oxide film, a silicon nitride film, and a sacrificial layer on the upper portion of the first substrate in a sequential manner. A sacrificial material used for the sacrificial layer may include poly-silicon and polymer. In this example, the silicon oxide film and the silicon nitride film may be used to form the protection layer.

The method for manufacturing the radio frequency filter 130 may involve patterning the sacrificial layer to match the shape of the air cavity. The shape of the air cavity may be determined to match an electrical property of the serial resonator 110 and the parallel resonator 120.

The method for manufacturing the radio frequency filter 130 may involve forming layers of the silicon oxide film, the silicon nitride film, and a first conductive layer on the upper portion of the patterned sacrificial layer in a sequential manner. In this example, the silicon oxide film and the silicon nitride film may be used to configure a membrane.

The method for manufacturing the radio frequency filter 130 may involve patterning the first electrode on the first conductive layer. In this instance, the patterning may be performed in a manner such that the serial resonator 110 is connected to another serial resonator (not shown) through the first electrode. The patterning may be performed in a manner such that the parallel resonator 120 is connected to another parallel resonator (not shown) through the first electrode. The patterning may be performed in a manner such that the serial resonator 110 and the parallel resonator 120 are connected through the first electrode.

The method for manufacturing the radio frequency filter 130 may involve forming the piezoelectric layer and a second conductive layer on the upper portion of the first electrode in a sequential manner.

The method for manufacturing the radio frequency filter 130 may involve depositing a temperature coefficient of frequency (TCF) compensation material on the upper portion of the piezoelectric layer, and subsequently to the layering of the piezoelectric layer. The method for manufacturing the radio frequency filter 130 may involve forming a TCF compensation layer having a width less than or equal to a width of either the piezoelectric layer or the second electrode by patterning the TCF compensation material.

Examples of materials that may be used as the TCF compensation material include at least one of silicon oxide, silicon nitride, a polymer, a carbon material, a metal, and a metal oxide material.

A TCF may refer to a variation of the resonant frequency in a temperature range in which the BAWR is used, and as a value of the TCF is closer to "0", a variation of a frequency due to a temperature change may be less.

The TCF of the BAWR may become close to "0" through the TCF compensation layer being formed by a material to balance the TCF of the BAWR.

The method for manufacturing the radio frequency filter 130 may involve patterning the second electrode on the second conductive layer. The method for manufacturing the radio frequency filter 130 may involve patterning the second electrode to have an area greater than or equal to an area of the TCF compensation layer in a plan view.

The patterning may be performed in a manner such that the serial resonator 110 is connected to another serial resonator (not shown) through the second electrode. The patterning may be performed in a manner such that the parallel resonator 120 is connected to another parallel resonator (not shown) through the second electrode. The patterning may be performed in a manner such that the serial resonator 110 and the parallel resonator 120 are connected through the second electrode.

The method for manufacturing the radio frequency filter 130 may involve layering the protection layer on the upper portion of the second electrode.

The method for manufacturing the radio frequency filter 130 may involve generating the air cavity by removing the sacrificial layer, based on the patterning of the sacrificial layer through a release hole (not shown).

The method for manufacturing the radio frequency filter 130 may involve generating the serial resonator 110 and the parallel resonator 120 including the first substrate, the air cavity, the membrane, the first electrode, the piezoelectric layer, the TCF compensation layer, the second electrode, and the protection layer. A difference between the serial resonator 110 and the parallel resonator 120 may be determined based on whether the BAWR is connected in series or in parallel. The difference between the serial connection and the parallel connection may be determined by the patterning of the first electrode and the patterning of the second electrode.

The method for manufacturing the radio frequency filter 130 may involve generating a via hole through etching a lower surface of a location corresponding to a predetermined area of the first electrode and a predetermined area of the second electrode on a substrate, such that the first electrode and the second electrode are connected to an external electrode.

Further, the method for manufacturing the radio frequency filter 130 may involve depositing the protection layer on a lower portion of the via hole, and depositing the conductive layer on the lower portion of the protection layer. The method for manufacturing the radio frequency filter 130 may involve generating the electric pad by patterning the conductive layer.

The method for manufacturing the radio frequency filter 130 may involve depositing the protection layer on the lower portion of the conductive layer.

The method for manufacturing the radio frequency filter 130 may involve bonding the second substrate and the first substrate. The second substrate may include an air cavity formed in a predetermined area of the lower surface of the second substrate. The air cavity of the second substrate may be formed to accept the serial resonator 110 and the parallel resonator 120. The second substrate may be bonded to the first substrate using a metal. For example, Au, tin (Sn), copper (Cu), and the like, may be used for the bonding.

In another example, the method for manufacturing the radio frequency filter 130 may involve depositing a TCF compensation material on the upper portion of the first electrode, subsequent to patterning of the first electrode. The method for manufacturing the radio frequency filter 130 may involve generating the TCF compensation layer having a width less than or equal to a width of the first electrode or the piezoelectric layer by patterning the TCF compensation material.

Figure 2:
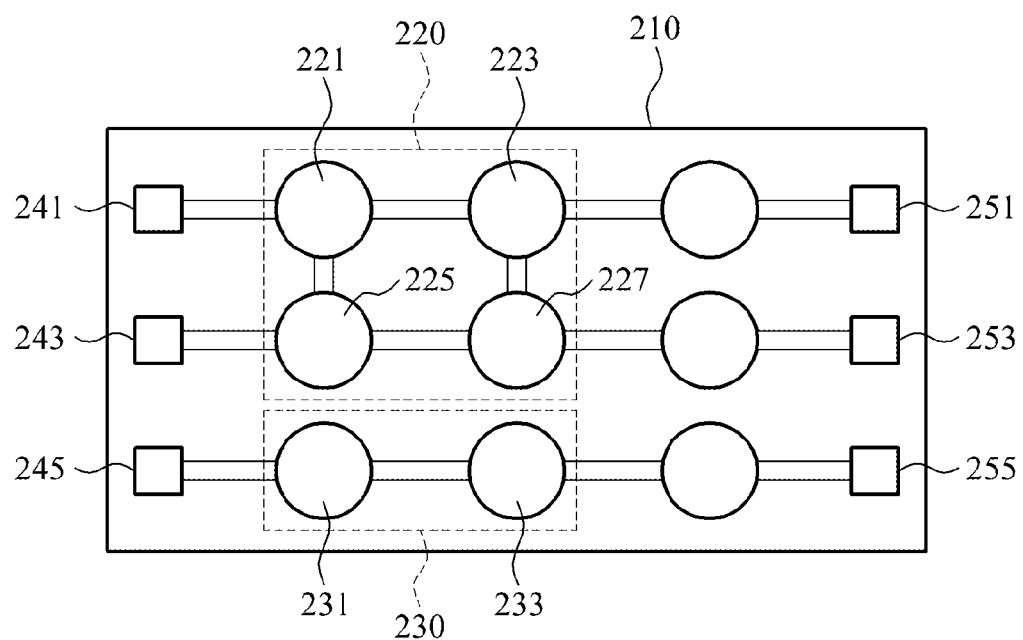
FIG. 2 is a plan view of an example of a radio frequency filter.

FIG. 2 illustrates an example of a radio frequency filter 210.

Referring to FIG. 2, the radio frequency filter 210 may include resonators 220, which may include at least one parallel resonator, serial resonators 230, and electrodes 241, 243, 245, 251, 253, and 255. Although, in FIG. 2, the radio frequency filter 210 includes both resonators 220 having at least one parallel resonator and serial resonators 230, a radio frequency filter may only include resonators 220 having at least one parallel resonator or only include serial resonators in another example.

In this example, the resonators 220 may include a BAWR 221, a BAWR 223, a BAWR 225, and a BAWR 227, having plural resonators respectively connected in parallel, e.g., in a lattice configuration. For example, it is also noted that resonators 220, including BAWR 221, BAWR 223, BAWR 225, and BAWR 227 may be connected in a ladder configuration.

The serial resonators 230 may be a BAWR 231 and a BAWR 233 that are connected in series.

The plurality of BAWRs 221, 223, 225, 227, 231, and 233 may have a structure in which a substrate, an air cavity, a membrane, a first electrode, a piezoelectric layer, a second electrode are layered in a sequential manner. At least one of the BAWRs 221, 223, 225, 227, 231, and 233 may include a TCF compensation layer.

A low frequency may become insensitive to a temperature change in a frequency band of the radio frequency filter 210 when at least one of the BAWRs 221 and 227 includes the TCF compensation layer. That is, a frequency change in a low frequency band may decrease. A high frequency may become insensitive to a temperature change in a frequency band of the radio frequency filter 210 when at least one of the BAWRs 223 and 225 includes the TCF compensation layer. That is, a frequency change in a high frequency band may decrease.

When at least one of the BAWRs 231 and 233 includes the TCF compensation layer, the frequency of the radio frequency filter 210 in a high frequency band may become insensitive to a temperature change. That is, a frequency change in a high frequency band may decrease.

The first electrode or the second electrode of the BAWR 221 may be connected to the electrode 241, the first electrode or the second electrode of the BAWR 225 may be connected to the electrode 243, and the first electrode or the second electrode of the BAWR 231 may be connected to the electrode 245. The electrodes 251, 253, and 255 may be connected to the first electrode or the second electrode of the BAWRs.

The plurality of BAWRs 221, 223, 225, 227, 231, and 233 may transmit a signal to an external device, or receive a signal from the external device through the electrodes 241, 243, 245, 251, 253, and 255.

Figure 3:
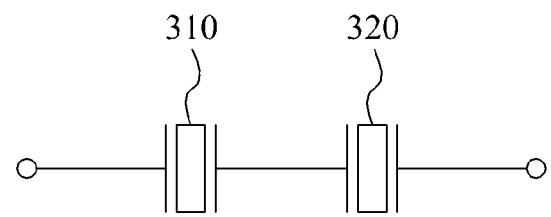
FIG. 3 is a diagram illustrating an example of a serial bulk acoustic wave resonator (BAWR) included in a radio frequency filter.

FIG. 3 illustrates an example of a serial BAWR included in a radio frequency filter.

FIG. 3 illustrates the serial resonators 230 of FIG. 2 in an equivalent circuit. The BAWR 231 may correspond to a BAWR 310 of FIG. 3, and the BAWR 233 of FIG. 2 may correspond to a BAWR 320 of FIG. 3. In this example, the serial resonators 230 may refer to the respective BAWRs 310 and 320 when the BAWR 310 and the BAWR 320 are connected in series.

Figure 4:
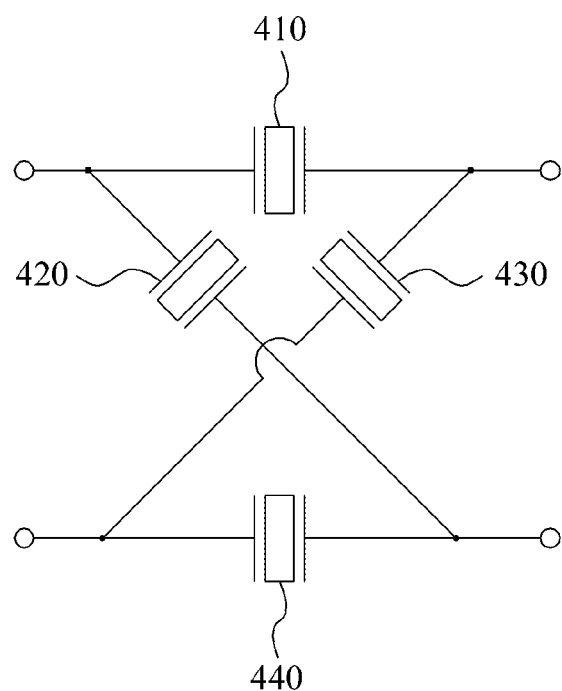
FIG. 4 is a diagram illustrating an example of a parallel BAWR included in a radio frequency filter.

FIG. 4 illustrates an example of a BAWR configuration, including one more BAWR resonators connected in parallel, included in a radio frequency filter.

FIG. 4 illustrates the resonators 220 of FIG. 2 in an example of an equivalent circuit. The BAWR 221 of FIG. 2 may correspond to a BAWR 410 of FIG. 4, the BAWR 223 of FIG. 2 may correspond to a BAWR 430, the BAWR 225 of FIG. 2 may correspond to a BAWR 420 of FIG. 4, and the BAWR 227 of FIG. 2 may correspond to a BAWR 440 of FIG. 4. Resonators 220 in the BAWR configuration may therefore refer to the parallel BAWRs 420 and 430, being connected in parallel, and BAWRs 410 and 440, connected in separate series. Thus, as an example, resonators 220 may form a lattice filter.

Figure 5:
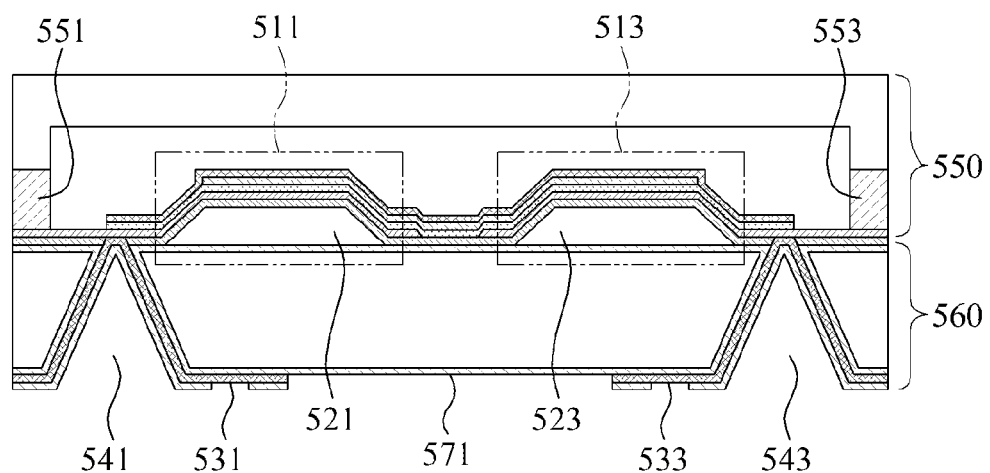
FIG. 5 is a cross-section view of an example of the radio frequency filter illustrated in FIG. 1 in greater detail.

FIG. 5 illustrates various structures of the example of radio frequency filter illustrated in FIG. 1 in detail.

Referring to FIG. 5, the radio frequency filter includes a serial resonator 511, a parallel resonator 513, a second substrate 550, a via hole 541, and a via hole 543. The serial resonator 511 may be implemented as a BAWR that is connected in series, and the parallel resonator 513 may be implemented as a BAWR that is connected in parallel.

The radio frequency filter may include both a serial resonator 511 and a parallel resonator 513, as in FIG. 5. However, in another example, the radio frequency filter may only include serial resonators or only include parallel resonators.

The serial resonator 511 may include a first substrate 560, a membrane layered on an upper portion of a first air cavity 521, a first lower electrode, a first piezoelectric layer, a first upper electrode, and a protection layer 571. The first air cavity 521 may be disposed on an upper portion of the first substrate 560. The serial resonator 511 may further include a TCF compensation layer.

The parallel resonator 513 may include the first substrate 560, a membrane layered on an upper portion of a second air cavity 523, a second lower electrode, a second piezoelectric layer, a second upper electrode, and the protection layer 571. The second air cavity 523 may be disposed on the upper portion of the first substrate 560. The parallel resonator 511 may further include the TCF compensation layer.

The via hole 541 and the via hole 543 may be formed in a predetermined area of the first substrate 560.

The via hole 541 may penetrate the first substrate 560, and may serve as a passage that connects the first lower electrode to an external electrode. The protection layer 571 may be layered on the via hole 541 and a lower portion of the first substrate 560. The protection layer 571 may protect the first substrate 560 during a process in which the via hole 541 is formed. The first lower electrode may be connected to the external electrode through a package electrode 531 layered on the protection layer 571.

The via hole 543 may penetrate the first substrate 560, and may serve as a passage that connects the second lower electrode to an external electrode. The protection layer 571 may be layered on the via hole 543 and the lower portion of the first substrate 560. The protection layer 571 may protect the first substrate 560 during a process of the via hole 543 formation. The second lower electrode may be connected to an external electrode through a package electrode 533 layered on the protection layer 571.

The second substrate 550 may include an air cavity formed in a predetermined area on a lower surface. The air cavity of the second substrate 550 may be formed to accept the first BAWR 511 and the second BAWR 513. The second substrate 550 may be bonded to the first substrate 560 using a metal 551 and a metal 553. The metals 551 and 553 may include Cu, Sn, Au, and the like.

FIGS. 6 to 13 illustrate various examples of BAWRs that may be included in a radio frequency filter.

Figure 6:
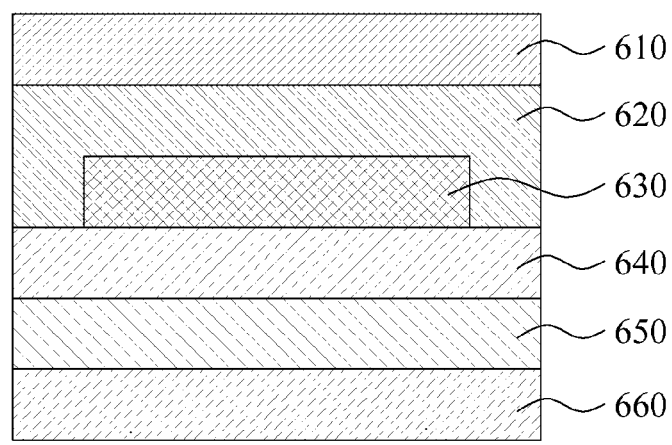
FIG. 6 is a diagram illustrating an example of a BAWR included in a radio frequency filter.

Referring to FIG. 6, the example of BAWR may include a protection layer 610, a second electrode 620, a TCF compensation layer 630, a piezoelectric layer 640, a first electrode 650, and a membrane 660.

The TCF compensation layer 630 may be disposed between the piezoelectric layer 640 and the second electrode 620. In a plan view, an area covered by the TCF compensation layer 630 may be smaller than an area covered by the piezoelectric layer 640. A remaining area aside from the area covered by the TCF compensation layer 630 from among an upper portion of the piezoelectric layer 640 may be filled with a material that forms the second electrode 620.

The TCF compensation layer 630 may compensate for a TCF of the protection layer 610, the second electrode 620, the piezoelectric layer 640, the first electrode 650, and the membrane 660.

The TCF compensation layer 630 may be formed of a material that balances the TCF of the protection layer 610, the second electrode 620, the piezoelectric layer 640, the first electrode 650, and the membrane 660, such that a TCF of the BAWR may become close to "0". A low frequency and a high frequency in a frequency band may be maintained consistently when the TCF of the BAWR becomes close to "0", despite an environmental temperature change.

Figure 7:
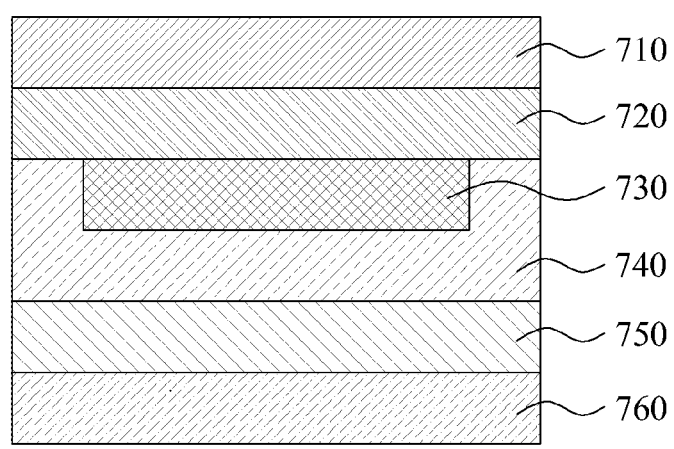
FIG. 7 is a diagram illustrating another example of a BAWR included in a radio frequency filter.

Referring to FIG. 7, in this example, the BAWR may include a protection layer 710, a second electrode 720, a TCF compensation layer 730, a piezoelectric layer 740, a first electrode 750, and a membrane 760.

In this example, the TCF compensation layer 730 is disposed between the piezoelectric layer 740 and the second electrode 720. In a plan view, an area of the TCF compensation layer 730 may be smaller than an area of the second electrode 720. A remaining area aside from the area of the TCF compensation layer 730 from among a lower portion of the second electrode 720 may be filled with a material that forms the piezoelectric layer 740.

The TCF compensation layer 730 may compensate for a TCF of the protection layer 710, the second electrode 720, the piezoelectric layer 740, the first electrode 750, and the membrane 760.

The TCF compensation layer 730 may be formed by a material that balances the TCF of the protection layer 710, the second electrode 720, the piezoelectric layer 740, the first electrode 750, and the membrane 760, such that the TCF of the BAWR may become close to "0". A low frequency and a high frequency in a frequency band may be maintained consistently when the TCF of the BAWR becomes close to "0", despite an environmental temperature change.

Figure 8:
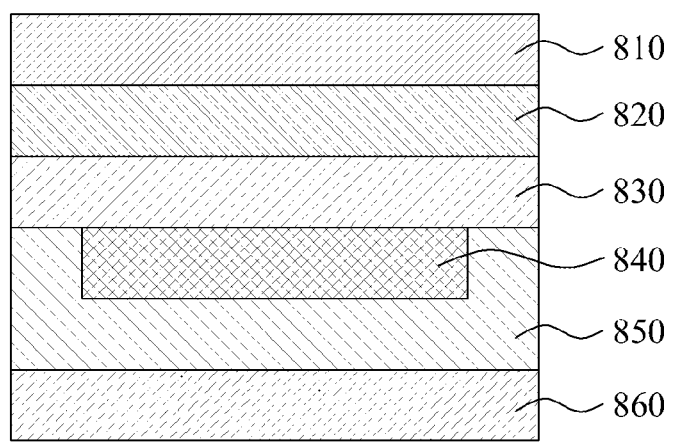
FIG. 8 is a diagram illustrating another example of a BAWR included in a radio frequency filter.

Referring to FIG. 8, the BAWR may include a protection layer 810, a second electrode 820, a piezoelectric layer 830, a TCF compensation layer 840, a first electrode 850, and a membrane 860.

The TCF compensation layer 840 may be disposed between the piezoelectric layer 830 and the first electrode 850. In a plan view, an area covered by the TCF compensation layer 840 may be smaller than an area covered by the piezoelectric layer 830. A remaining area aside from the area of the TCF compensation layer 840 from among a lower portion of the piezoelectric layer 830 may be filled with a material that forms the first electrode 850.

The TCF compensation layer 840 may compensate for a TCF of the protection layer 810, the second electrode 820, the piezoelectric layer 830, the first electrode 850, and the membrane 860.

The TCF compensation layer 840 may be formed by a material that balances the TCF of the protection layer 810, the second electrode 820, the piezoelectric layer 830, the first electrode 850, and the membrane 860, such that the TCF of the BAWR may become close to "0". A low frequency and a high frequency in a frequency band may be maintained consistently when the TCF of the BAWR becomes close to "0", despite an environmental temperature change.

Figure 9:
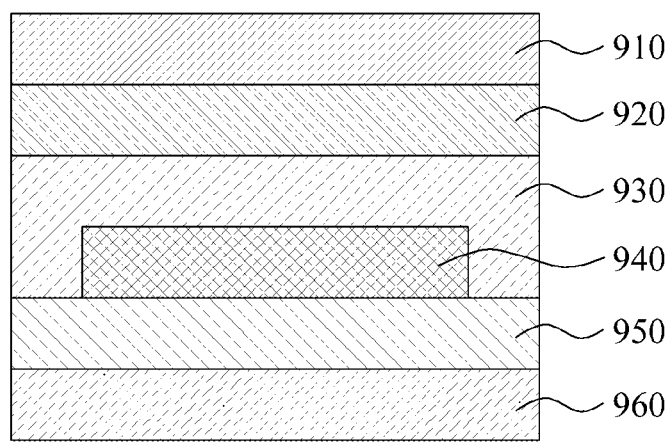
FIG. 9 is a diagram illustrating another example of a BAWR included in a radio frequency filter.

Referring to FIG. 9 the illustrated example of BAWR includes a protection layer 910, a second electrode 920, a piezoelectric layer 930, a TCF compensation layer 940, a first electrode 950, and a membrane 960.

The TCF compensation layer 940 may be disposed between the piezoelectric layer 930 and the first electrode 950. In a plan view, an area of the TCF compensation layer 940 may be smaller than an area of the first electrode 950. A remaining area aside from the area of the TCF compensation layer 940 from among an upper portion of the first electrode 950 may be filled with a material that forms the piezoelectric layer 930.

The TCF compensation layer 940 may compensate for a TCF of the protection layer 910, the second electrode 920, the piezoelectric layer 930, the first electrode 950, and the membrane 960.

The TCF compensation layer 940 may be formed with a material that balances the TCF of the protection layer 910, the second electrode 920, the piezoelectric layer 930, the first electrode 950, and the membrane 960 such that the TCF of the BAWR may become close to "0". A low frequency and a high frequency in a frequency band may be maintained consistently when the TCF of the BAWR becomes close to "0", despite an environmental temperature change.

Figure 10:
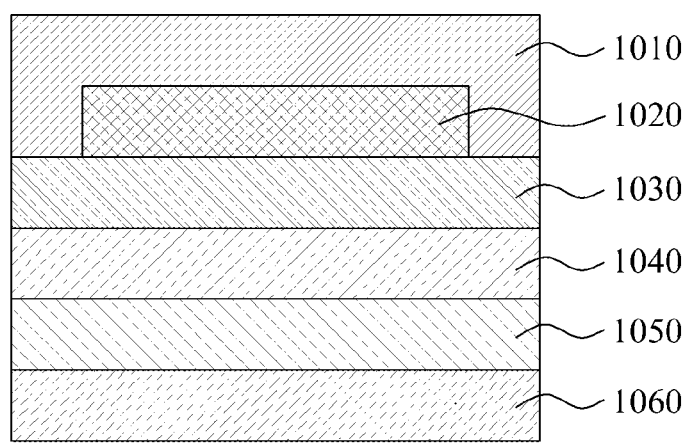
FIG. 10 is a diagram illustrating another example of a BAWR included in a radio frequency filter.

Referring to FIG. 10, the BAWR may include a protection layer 1010, a TCF compensation layer 1020, a second electrode 1030, a piezoelectric layer 1040, a first electrode 1050, and a membrane 1060.

The TCF compensation layer 1020 may be disposed between the protection layer 1010 and the second electrode 1030. In a plan view, an area of the TCF compensation layer 1020 may be smaller than an area of the second electrode 1030. A remaining area aside from the area of the TCF compensation layer 1020 from among an upper portion of the second electrode 1030 may be filled with a material that forms the protection layer 1010.

The TCF compensation layer 1020 may compensate for a TCF of the protection layer 1010, the second electrode 1030, the piezoelectric layer 1040, the first electrode 1050, and the membrane 1060.

The TCF compensation layer 1020 may be formed by a material that balances the TCF of the protection layer 1010, the second electrode 1030, the piezoelectric layer 1040, the first electrode 1050, and the membrane 1060, such that the TCF of the BAWR may become close to "0". A low frequency and a high frequency in a frequency band may be maintained consistently when the TCF of the BAWR becomes close to "0", despite an environmental temperature change.

Figure 11:
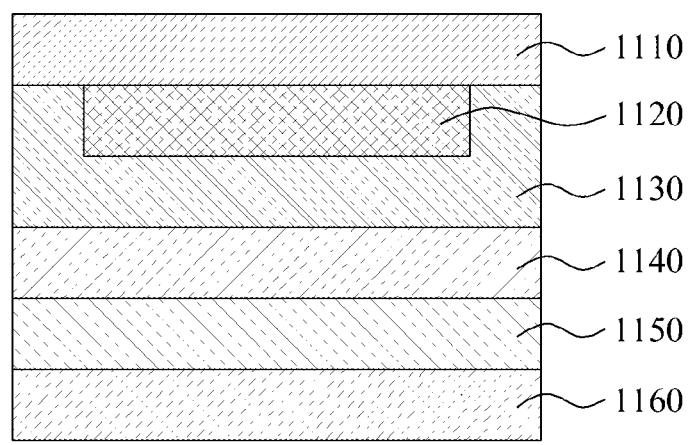
FIG. 11 is a diagram illustrating another example of a BAWR included in a radio frequency filter.

Referring to FIG. 11, the BAWR may include a protection layer 1110, a TCF compensation layer 1120, a second electrode 1130, a piezoelectric layer 1140, a first electrode 1150, and a membrane 1160.

The TCF compensation layer 1120 may be disposed between the protection layer 1110 and the second electrode 1130. In a plan view, an area of the TCF compensation layer 1120 may be smaller than an area of the protection layer 1110. A remaining area aside from the area of the TCF compensation layer 1120 from among a lower portion of the protection layer 1110 may be filled with a material that forms the second electrode 1130.

The TCF compensation layer 1120 may compensate for a TCF of the protection layer 1110, the second electrode 1130, the piezoelectric layer 1140, the first electrode 1150, and the membrane 1160.

The TCF compensation layer 1120 may be formed by a material that balances the TCF of the protection layer 1110, the second electrode 1130, the piezoelectric layer 1140, the first electrode 1150, and the membrane 1160, such that the TCF of the BAWR may become close to "0". A low frequency and a high frequency in a frequency band may be maintained consistently when the TCF of the BAWR becomes close to "0", despite an environmental temperature change.

Figure 12:
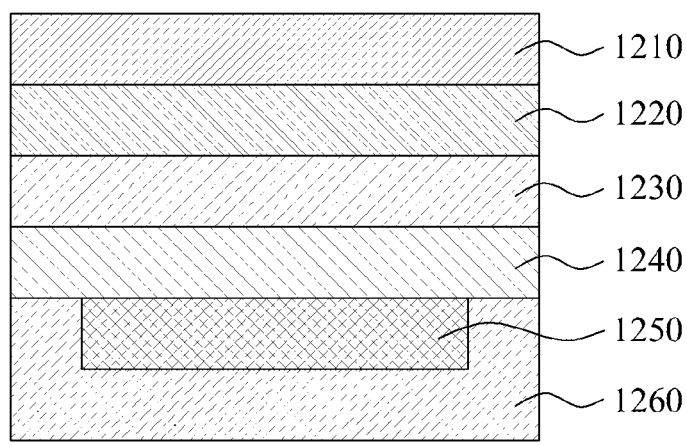
FIG. 12 is a diagram illustrating another example of a BAWR included in a radio frequency filter.

Referring to FIG. 12, the BAWR may include a protection layer 1210, a second electrode 1220, a piezoelectric layer 1230, a first electrode 1240, a TCF compensation layer 1250, and a membrane 1260.

The TCF compensation layer 1250 may be disposed between the first electrode 1240 and the membrane 1260. In a plan view, an area covered by the TCF compensation layer 1250 may be smaller than an area covered by the first electrode 1240. A remaining area aside from the area of the TCF compensation layer 1250 from among a lower portion of the first electrode 1240 may be filled with a material that forms the membrane 1260.

The TCF compensation layer 1250 may compensate for a TCF of the protection layer 1210, the second electrode 1220, the piezoelectric layer 1230, the first electrode 1240, and the membrane 1260.

The TCF compensation layer 1250 may be formed by a material that balances the TCF of the protection layer 1210, the second electrode 1220, the piezoelectric layer 1230, the first electrode 1240, and the membrane 1260, such that the TCF of the BAWR may become close to "0". A low frequency and a high frequency in a frequency band may be maintained consistently when the TCF of the BAWR becomes close to "0", despite an environmental temperature change.

Figure 13:
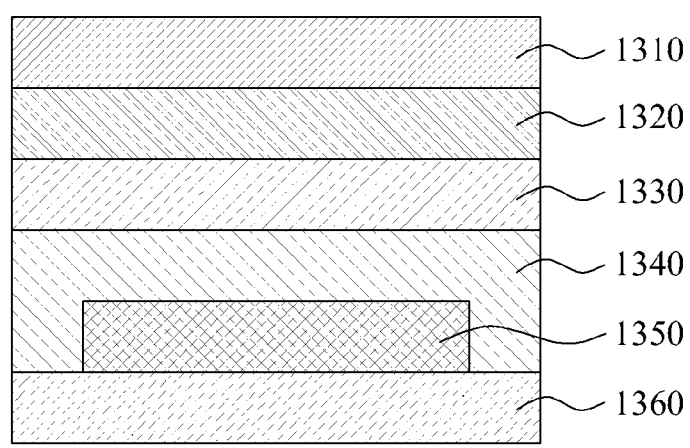
FIG. 13 is a diagram illustrating another example of a BAWR included in a radio frequency filter.

Referring to FIG. 13, the BAWR may include a protection layer 1310, a second electrode 1320, a piezoelectric layer 1330, a first electrode 1340, a TCF compensation layer 1350, and a membrane 1360.

The TCF compensation layer 1350 may be disposed between the first electrode 1340 and the membrane 1360. In a plan view, an area of the TCF compensation layer 1350 may be smaller than an area of the membrane 1360. A remaining area aside from the area of the TCF compensation layer 1350 from among an upper portion of the membrane 1360 may be filled with a material that forms the first electrode 1340.

The TCF compensation layer 1350 may compensate for a TCF of the protection layer 1310, the second electrode 1320, the piezoelectric layer 1330, the first electrode 1340, and the membrane 1360.

The TCF compensation layer 1350 may be formed by a material that balances the TCF of the protection layer 1310, the second electrode 1320, the piezoelectric layer 1330, the first electrode 1340, and the membrane 1360, such that the TCF of the BAWR may become close to "0". A low frequency and a high frequency in a frequency band may be maintained consistently when the TCF of the BAWR becomes close to "0", despite an environmental temperature change.

Figure 14:
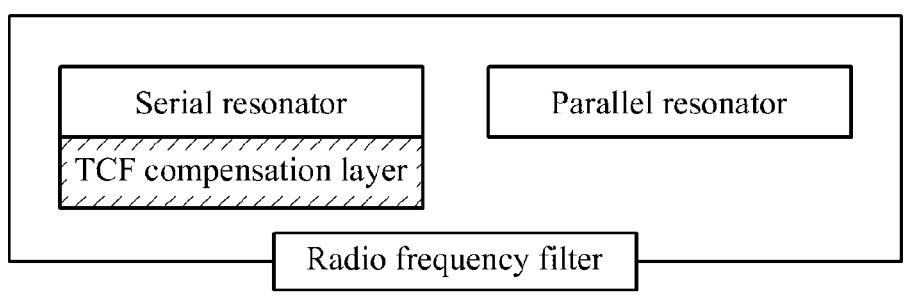
FIG. 14 is a diagram illustrating the arrangement of a temperature coefficient of frequency (TCF) in an example of a radio frequency filter.
Figure 15:
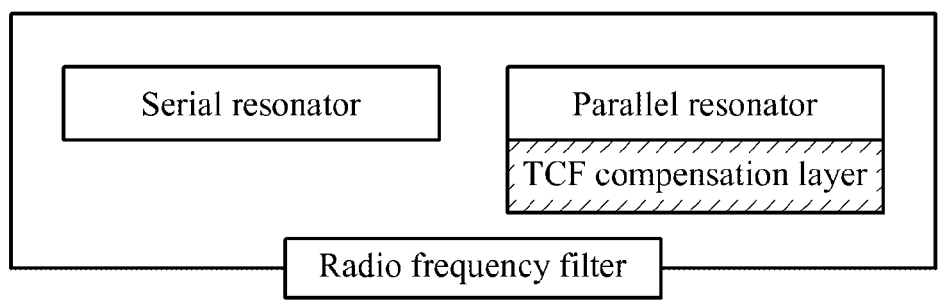
FIG. 15 is a diagram illustrating the arrangement of a temperature coefficient of frequency (TCF) in another example of a radio frequency filter.
Figure 16:
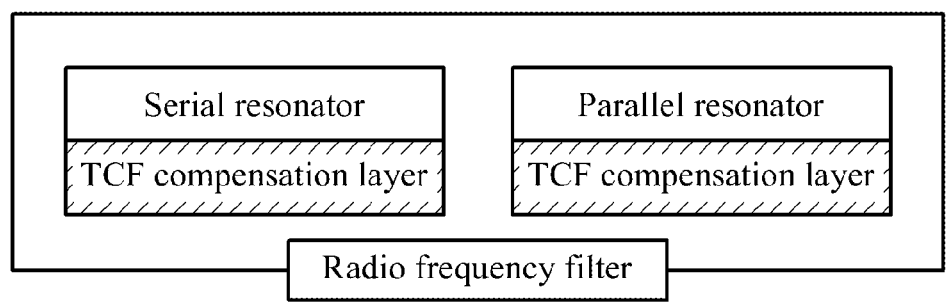
FIG. 16 is a diagram illustrating the arrangement of a temperature coefficient of frequency (TCF) in another example of a radio frequency filter.

FIGS. 14 to 16 illustrate examples of arrangement of TCF compensation layers in a radio frequency filter.

Referring to FIG. 14, the radio frequency filter may include a serial resonator and a parallel resonator. In this example, the serial resonator may refer to one of the BAWRs connected in series, and the parallel resonator may refer to one of the BAWRs connected in parallel. In the example of FIG. 14, only the serial resonator may include a TCF compensation layer. When the TCF compensation layer is included in the serial resonator, a high frequency band may be maintained consistently in a bandwidth of the radio frequency filter, irrespective of a temperature change.

Referring to FIG. 15, the radio frequency filter may include the serial resonator and the parallel resonator. In the example of FIG. 15, only the parallel resonator may include the TCF compensation layer. When the TCF compensation layer is included in the parallel resonator, a low frequency may be maintained consistently in a bandwidth of the radio frequency filter, irrespective of a temperature change.

Referring to FIG. 16, the radio frequency filter may include the serial resonator and the parallel resonator. In the example of FIG. 16, both the serial resonator and the parallel resonator may include the TCF compensation layer. In this example, a high frequency and a low frequency both may be maintained consistently in a bandwidth of the radio frequency filter, irrespective of a temperature change.

FIG. 17 illustrates an example of a method of fabricating a radio frequency filter. A radio frequency filter may be fabricated to include a plurality of BAWRs on a first substrate.

In a method of fabricating a radio frequency filter, as in 1710, a silicon oxide film, a silicon nitride film, and a sacrificial layer may be formed sequentially on a first substrate. As in 1720, the sacrificial layer may be patterned to match a shape of an air cavity. As in 1730, a silicon oxide film, a silicon nitride film, a first conductive layer may be formed on top of the patterned sacrificial layer in a sequential manner. As in 1740, a first electrode may be generated on the first conductive layer by patterning the first conductive layer. As in 1750, a piezoelectric layer and a TCF compensation layer may be formed on the first electrode. As in 1760, a second electrode may be formed by patterning a second conductive layer. The second electrode may be patterned based on at least one of a serial connection and a parallel connection of bulk acoustic wave resonators (BAWRs). While not limited thereto, various arrangements of BAWRs are described above. As in 1770, a protection layer may be formed on the second electrode. As in 1780, the air cavity may be generated by removing the sacrificial layer. As in 1790, a via hole may be generated by etching a location of the first substrate that corresponds to a predetermined area of the first electrode and a predetermined area of the second electrode. As in 1795, a second substrate may be bonded on the first substrate to from a second air cavity between the first substrate and a lower surface of the second substrate.

The TCF compensation layer may be formed using a TCF compensation material. Examples of materials suitable for forming the TCF compensation layer are described above. The TCF compensation material may be formed above or below the piezoelectric layer. The configuration of the TCF compensation material may correspond to any of the examples discussed with respect to FIGS. 6 to 13. Further, the shape of the air cavity, the via hole, and the second substrate may correspond to any of the examples discussed above, and a detailed description thereof is omitted.

In one example, the TCF compensation layer may be formed by depositing a temperature coefficient of frequency (TCF) compensation material on the piezoelectric layer or the first electrode, and forming a TCF compensation layer having a width less than or equal to a width of the piezoelectric layer or the second electrode by patterning the TCF compensation material. That is, an area covered by the TCF compensation layer may be less than an area covered by the piezoelectric layer or the second electrode in a plan view.

According to various examples described herein, a radio frequency filter may include a TCF compensation layer in at least one of a serial resonator and a parallel resonator, such that an RF property of a right and left frequency band in a frequency bandwidth of a filter may be adjusted.

For example, only a lower frequency band may generate a temperature compensating effect in a frequency bandwidth of a Tx filter, and a high frequency band in a bandwidth of a remaining Tx filter and a bandwidth of an Rx filter may be maintained in a previous state. In particular, a variation range of a resonant frequency may decrease only in a low frequency band in a frequency bandwidth of the Tx filter.

A variable RF property and a deteriorating RF property may be addressed by applying a TCF compensation layer selectively for a plurality of resonators inside a radio frequency filter, and by applying the TCF compensation layer collectively.

According to various examples described herein, a radio frequency filter may use at least one of the BAWRs connected in series and in parallel, and may transmit and receive a radio frequency without being influenced by a temperature change in surroundings due to a TCF compensation layer included in the BAWRs being used.

According to various examples described herein, a radio frequency filter may enable a development of a filter and a duplexer of which a frequency band is consistent in an instance of a changing environmental temperature. An occurrence of interference may be prevented when a frequency band gap decreases, using such a duplexer.

According to various examples described herein, it is possible to use a limited frequency resource efficiently by performing communication without interference, even in an environment in which a frequency band gap is narrow, using a radio frequency filter.

According to various examples described herein, a radio frequency filter may include bulk acoustic wave resonators (BAWRs), and the BAWRs may include at least one of first BAWRs connected in series and second BAWRs connected in parallel.

Each of the BAWRs may include a first substrate, an air cavity disposed on an upper portion of the first substrate, a membrane disposed on an upper portion of the air cavity, a first electrode disposed on an upper portion of the membrane, a piezoelectric layer disposed on an upper portion of the first electrode, and a second electrode disposed on an upper portion of the piezoelectric layer.

Each of the BAWRs may further include a temperature coefficient of frequency (TCF) compensation layer configured to compensate for a TCF of the first electrode, the piezoelectric layer, and the second electrode.

Each of the BAWRs may further include a protection layer configured to protect the second electrode from an external environment, disposed on an upper portion of the second electrode.

The TCF compensation layer may be disposed between the piezoelectric layer and the second electrode, and a width of the TCF compensation layer may be an area less than or equal to at least one of the piezoelectric layer and the second electrode.

The TCF compensation layer may be disposed between the piezoelectric layer and the first electrode, and a width of the TCF compensation layer may be an area less than or equal to at least one of the piezoelectric layer and the first electrode.

The TCF compensation layer may be disposed between the first electrode and the membrane, and a width of the TCF compensation layer may be an area less than or equal to at least one of the first electrode and the membrane.

The TCF compensation layer may be disposed between the second electrode and a protection layer, and a width of the TCF compensation layer may be an area less than or equal to at least one of the piezoelectric layer and the protection layer.

A first BAWR may include a TCF compensation layer configured to compensate for a TCF of the first BAWR.

A second BAWR may include a TCF compensation layer configured to compensate for a TCF of the second BAWR.

All of the first BAWRs may include a TCF compensation layer configured to compensate for a TCF of the first BAWRs.

All of the second BAWRs may include a TCF compensation layer configured to compensate for the TCF of the second BAWRs.

The radio frequency filter may further include a second substrate including an air cavity formed in a predetermined area of a lower surface, and disposed to be bonded with the first substrate.

At least one of the first BAWRs may include a TCF compensation layer to compensate for a change due to a temperature change of a high frequency band in a bandwidth of a radio frequency filter, and at least one of the second BAWRs may include a TCF compensation layer to compensate for a change due to a temperature change of a low frequency band in a bandwidth of the radio frequency filter.

The TCF compensation layer may include at least one of a silicon oxide type, a silicon nitride type, a polymer, a carbon material, a metal, and a metal oxide material.

A plurality of second electrodes of the first BAWRs may be connected to a plurality of second electrodes of the second BAWRs.

A plurality of second electrodes of the first BAWRs may be connected to a plurality of first electrodes of the second BAWRs.

According to various examples described herein, a method for manufacturing a radio frequency filter may involve layering a silicon oxide film, a silicon nitride film, and a sacrificial layer on an upper portion of a substrate in a sequential manner, patterning the sacrificial layer to match a form of an air cavity, layering a silicon oxide film, a silicon nitride film, a first conductive layer on an upper portion of the sacrificial layer patterned in a sequential manner, patterning a first electrode on the first conductive layer, layering a piezoelectric layer and a second conductive layer on an upper portion of the first electrode, patterning a second electrode on the second conductive layer, based on at least one of a serial connection and a parallel connection of bulk acoustic wave resonators (BAWRs), layering a protection layer on an upper portion of the second electrode, generating the air cavity by removing the sacrificial layer, based on the patterning of the sacrificial layer, and generating a via hole by etching a location corresponding to a predetermined area of the first electrode and a predetermined area of the second electrode on the substrate.

An example of the method for manufacturing the radio frequency filter may further include depositing a temperature coefficient of frequency (TCF) compensation material on an upper portion of the piezoelectric layer, subsequent to the layering of the piezoelectric layer, and generating a TCF compensation layer having an area less than or equal to an area of at least one of the piezoelectric layer and the second electrode by patterning the TCF compensation material.

An example method for manufacturing the radio frequency filter may further include depositing a TCF compensation material on the upper portion of the first electrode, subsequent to the patterning of the first electrode, and generating a TCF compensation layer having an area less than or equal to an area of at least one of the first electrode and the piezoelectric layer by patterning the TCF compensation material.

The processes, functions, methods and/or software described above including a method for manufacturing a radio frequency filter may be recorded, stored, or fixed in one or more non-transitory computer-readable storage media that includes program instructions to be implemented by a computer to cause a processor to execute or perform the program instructions. The media may also include, alone or in combination with the program instructions, data files, data structures, and the like. The media and program instructions may be those specially designed and constructed, or they may be of the kind well-known and available to those having skill in the computer software arts. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations and methods described above, or vice versa. In addition, a non-transitory computer-readable storage medium may be distributed among computer systems connected through a network and non-transitory computer-readable codes or program instructions may be stored and executed in a decentralized manner.

As a non-exhaustive illustration only, a communication terminal described herein may refer to mobile devices such as, for example, a cellular phone, a smart phone, a wearable smart device (such as, for example, a ring, a watch, a pair of glasses, a bracelet, an ankle bracket, a belt, a necklace, an earring, a headband, a helmet, a device embedded in the cloths or the like), a personal computer (PC), a tablet personal computer (tablet), a phablet, a personal digital assistant (PDA), a digital camera, a portable game console, an MP3 player, a portable/personal multimedia player (PMP), a handheld e-book, an ultra mobile personal computer (UMPC), a portable lab-top PC, a global positioning system (GPS) navigation, and devices such as a high definition television (HDTV), an optical disc player, a DVD player, a Blue-ray player, a setup box, or any other device capable of wireless communication or network communication consistent with that disclosed herein. In a non-exhaustive example, the wearable device may be self-mountable on the body of the user, such as, for example, the glasses or the bracelet. In another non-exhaustive example, the wearable device may be mounted on the body of the user through an attaching device, such as, for example, attaching a smart phone or a tablet to the arm of a user using an armband, or hanging the wearable device around the neck of a user using a lanyard.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency filter, comprising:
plural film bulk acoustic wave resonators (BAWRs) to perform a frequency band filtering, the plural BAWRs comprising first BAWRs connected in series and second BAWRs including at least one BAWR connected in parallel,
wherein at least one of the first BAWRs comprises a first protection layer, a membrane, and a temperature coefficient of frequency (TCF) compensation layer, embedded in at least one electrode, configured to compensate for a change due to a temperature change,
wherein the at least one of the second BAWRs comprises the first protection layer and the membrane and does not comprise a TCF compensation layer configured to compensate for a change due to the temperature change, and
wherein the first protection layer and the membrane are disposed on an upper surface of a first substrate, with a metal layer being disposed in a different layer on the upper surface of the first substrate than a second protection layer formed on the upper surface of the first substrate, the second protection layer being disposed below the membrane so as to form a first air cavity therebetween.

2. The radio frequency filter of claim 1, wherein the at least one of the first BAWRs comprises:
the membrane, a first electrode, a piezoelectric layer, and a second electrode, disposed in that order on the upper surface of the first substrate, wherein one of the first electrode and the second electrode is the at least one electrode.

3. The radio frequency filter of claim 2, wherein the TCF compensation layer of the at least one of the first BAWRs is configured to compensate for a TCF of the first electrode, the piezoelectric layer, and the second electrode.

4. The radio frequency filter of claim 3, wherein the TCF compensation layer of the at least one of the first BAWRs comprises at least one selected from the group consisting of a silicon oxide type, a silicon nitride type, a polymer, a carbon material, a metal, and a metal oxide material.

5. The radio frequency filter of claim 3, wherein the at least one electrode is the second electrode, and a width of the TCF compensation layer of the at least one of the first BAWRs is less than a width of the second electrode.

6. The radio frequency filter of claim 3, wherein the at least one electrode is the first electrode, and a width of the TCF compensation layer of the at least one of the first BAWRs is less than a width of the first electrode.

7. The radio frequency filter of claim 2, wherein the first protection layer is disposed on the second electrode.

8. The radio frequency filter of claim 7, wherein a third protection layer is disposed on a lower surface of the first substrate above a first electrode pad disposed on the lower surface of the first substrate, the first electrode pad being electrically connected to the first electrode through a via hole in the second protection layer and the membrane.

9. The radio frequency filter of claim 8, wherein a package electrode corresponding to one of the first BAWRs, as the first electrode pad, and a package electrode corresponding to one of the second BAWRs are respectively formed using respective electrode pads formed on the lower surface of the first substrate through a fourth protective layer formed on the lower surface of the first substrate.

10. The radio frequency filter of claim 2, wherein the plural BAWRs each comprise respective first electrodes, piezoelectric layers, and second electrodes, and a plurality of the respective second electrodes of the first BAWRs are connected to a plurality of the respective second electrodes of the second BAWRs.

11. The radio frequency filter of claim 2, wherein the plural BAWRs each comprise respective first electrodes, respective piezoelectric layers, and respective second electrodes, and a plurality of the respective second electrodes of the first BAWRs are connected to a plurality of the respective first electrodes of the second BAWRs.

12. The radio frequency filter of claim 2, wherein the plural BAWRs each comprise respective first electrodes, respective piezoelectric layers, and respective second electrodes, and the at least one of the first BAWRs shares a same second electrode, and has an electrically separate first electrode, from the at least one of the second BAWRs.

13. The radio frequency filter of claim 1, wherein the TCF compensation layer of the at least one of the first BAWRs is configured to compensate for the change due to the temperature change of a high frequency band in a bandwidth of the radio frequency filter.

14. A radio frequency filter, comprising:
plural film bulk acoustic wave resonators (BAWRs) to perform a frequency band filtering, the plural BAWRs comprising first BAWRs connected in series and second BAWRs including at least one BAWR connected in parallel
wherein at least one of the first BAWRs comprises a protection layer and a membrane and does not comprise a temperature coefficient of frequency (TCF) compensation layer configured to compensate for a change due to a temperature change,
wherein the at least one of the second BAWRs comprises the protection layer, the membrane, and a TCF compensation layer, embedded in at least one electrode, configured to compensate for a change due to the temperature change, and
wherein the protection layer and the membrane are disposed on an upper surface of a first substrate, with a metal layer being disposed in a different layer on the upper surface of the first substrate than a second protection layer formed on the upper surface of the first substrate, the second protection layer being disposed below the membrane so as to form a first air cavity therebetween.

15. A radio frequency filter, comprising:
plural film bulk acoustic wave resonators (BAWRs) to perform a frequency band filtering, the plural BAWRs comprising first BAWRs connected in series and second BAWRs including at least one BAWR connected in parallel,
wherein a BAWR of the plural BAWRs comprises a second electrode, a temperature coefficient of frequency (TCF) compensation layer, a piezoelectric layer, and a first electrode of the BAWR, with the TCF compensation layer of the BAWR being embedded in the second electrode of the BAWR,
wherein another BAWR of the plural BAWRs comprises a second electrode, a temperature coefficient of frequency (TCF) compensation layer, a piezoelectric layer, and a first electrode of the other BAWR, with the TCF compensation layer of the other BAWR being embedded in the first electrode of the other BAWR, and
wherein the BAWR is one of the first BAWRs connected in series and the other BAWR is one of the second BAWRs including the at least one BAWR connected in parallel.

16. The filter of claim 15, wherein at least the first electrode of the BAWR and the first electrode of the other BAWR are connected.

17. The filter of claim 15, wherein the BAWR and the other BAWR are formed on a substrate, and share a protection layer being disposed below a shared membrane so as to form respective air cavities therebetween.

18. A radio frequency filter, comprising:
plural film bulk acoustic wave resonators (BAWRs) to perform a frequency band filtering, the plural BAWRs comprising first BAWRs connected in series and second BAWRs including at least one BAWR connected in parallel,
wherein a BAWR of the plural BAWRs comprises a second electrode, a temperature coefficient of frequency (TCF) compensation layer, a piezoelectric layer, and a first electrode of the BAWR, with the TCF compensation layer of the BAWR being embedded in the second electrode of the BAWR,
wherein another BAWR of the plural BAWRs comprises a second electrode, a temperature coefficient of frequency (TCF) compensation layer, a piezoelectric layer, and a first electrode of the other BAWR, with the TCF compensation layer of the other BAWR being embedded in the first electrode of the other BAWR, and
wherein the BAWR is one of the second BAWRs including the at least one BAWR connected in parallel and the other BAWR is one of the first BAWRs connected in series.

19. The filter of claim 18, wherein at least the first electrode of the BAWR and the first electrode of the other BAWR are connected.

20. The filter of claim 18, wherein the BAWR and the other BAWR are formed on a substrate, and share a protection layer being disposed below a shared membrane so as to form respective air cavities therebetween.

* * * * *